United States Patent
Chen et al.

(10) Patent No.: US 6,260,264 B1
(45) Date of Patent: *Jul. 17, 2001

(54) METHODS FOR MAKING Z-AXIS ELECTRICAL CONNECTIONS

(75) Inventors: Yu Chen; Joel A. Gerber, both of St. Paul; Peter B. Hogerton, White Bear Lake, all of MN (US)

(73) Assignee: 3M Innovative Properties Company, St. Paul, MN (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/986,661

(22) Filed: Dec. 8, 1997

(51) Int. Cl.[7] .................................................. H05K 3/30
(52) U.S. Cl. .............. 29/832; 29/834; 174/260; 174/261; 257/737; 257/738; 361/760; 428/343; 428/356; 439/68
(58) Field of Search ................... 174/260, 261; 257/737, 738, 780, 783; 361/760; 439/68; 29/832, 825, 834; 427/289; 428/343, 356; 228/180.22

(56) References Cited

U.S. PATENT DOCUMENTS

| 5,068,714 | 11/1991 | Seipler ............................ 257/703 |
| 5,128,746 | 7/1992 | Shi et al. ......................... 257/738 |
| 5,497,938 | * 3/1996 | McMahon et al. . |
| 5,543,585 | 8/1996 | Booth et al. ...................... 174/261 |
| 5,751,068 | * 5/1998 | McMahon et al. . |

FOREIGN PATENT DOCUMENTS

| 0 099 544 | 7/1983 | (EP) ........................... H01L/21/48 |
| 0 332 402 A2 | 9/1989 | (EP) . |
| 0 560 072 A2 | 9/1993 | (EP) . |
| 61-30059 | * 2/1986 | (JP) . |
| 1-164041 | * 6/1989 | (JP) . |
| 2-23623 | * 1/1990 | (JP) . |
| 4-304640 | * 10/1992 | (JP) . |

OTHER PUBLICATIONS

Proc. of the 1995 Internat Electronics Packaging conference (1995) a paper by Ostmann et al on pp. 354–366.*

Proc. of the 1995 Japan Internat. Electronic Manufacturing Technology Symposium (1996) a paper by Kloser et al on pp. 60–66.*

J. Microcircuits Electronic Packaging (USA) vol 20, No. 3, pp 383–91, (1997) by Kloser et al.*

High Performance Underfills for Low–Cost Flipchip Applications, Proc. 3d Int'l Symp. On Adv. Packaging Materials, Mar. 1997.

(List continued on next page.)

*Primary Examiner*—Carl J. Arbes
(74) *Attorney, Agent, or Firm*—Matthew B. McNutt

(57) ABSTRACT

The present invention relates to a method for connecting an integrated circuit chip to a circuit substrate. The method includes the step of the steps pre-applying adhesive directly to a bumped side of integrated circuit chip. The method also includes the step of pressing the bumped side of the integrated circuit chip, which has previously been coated with adhesive, against the circuit substrate such that the bumps provide an electrical connection between the integrated circuit chip and the circuit substrate. The pre-applied adhesive on the chip forms a bond between the integrated circuit chip and the circuit substrate.

11 Claims, 11 Drawing Sheets

OTHER PUBLICATIONS

Gamota et al., Advanced Flipchip Materials: Reflowable Underfill Systems, Proc. Pac. Rim ASME Int'l Intersociety Electronic and Photonic Packaging Conf., ASME, Jun. 1997.

Johnson et al., Reflow Curable Polymer Fluxes for Flipchip Assembly, Proc. Surface Mount Int'l 1997.

Gilleo, Ken, Direct Chip Interconnect Using Polymer Bonding, Proceedings of the Electronic Components Conference, Houston, May 22–25, 1989, No. Conf. 39, 22 May 1989, pp. 37–44.

Direct Chip Bonding Using Transferred Conuctive Adhesive Film, IBM Technical Disclosure Bulletin, vol 32, No. 10B, Mar. 1, 1990, pp. 474–475.

* cited by examiner

METHODS FOR MAKING Z-AXIS ELECTRICAL CONNECTIONS

FIELD OF THE INVENTION

The present invention relates generally methods and apparatuses for forming electrical connections. More specifically, the present invention relates to methods and apparatuses for making z-axis electrical connections between integrated circuit chips and their packaging circuits.

BACKGROUND OF THE INVENTION

The vast majority of electronic circuit assemblies in the world today utilize integrated circuit (IC) chips which have been housed in protective packages. These packages provide mechanical and sometimes thermal protection for the chips while also providing an intermediate level of interconnection between the chips and printed circuit boards. Years ago, package sizes were large compared to the size of chips. In part this was necessary because attainable feature sizes for printed circuit boards (PCB) were very large compared to those of chips. Over time, the ability to produce fine-featured circuit boards has improved and package sizes have correspondingly decreased relative to IC size. However, because of the needs to cut costs and reduce circuit size and improve performance, there has been a drive to develop circuit assembly methods which minimize the materials and processes which are required to yield a functional device.

One technique used to reduce circuit size and improve performance involves attaching IC devices directly to a substrate using perimeter or area arrays of solder balls mounted on the face of a chip. By inverting or "flipping" the chip such that the balls are placed in contact with pads on the substrate and passing the entire assembly through a solder reflow process, the IC may be metallurgically bonded to the substrate. Although flip-chip assembly technology was first pioneered over 30 years ago, it has been successfully exploited in only a few different segments of the electronics industry. The most notable examples of electronic products which have exploited flip-chip assembly include wristwatches, automotive sensors/controllers and mainframe computers. These applications are characterized by the need for either extremely compact circuit size (watches, automotive) or by extremely high computing power per unit volume (mainframes). This underscores the simple fact that by eliminating the intermediate IC package, flip-chip assembly provides the smallest possible footprint for silicon on the circuit board.

A primary reason why flip-chip technology has not enjoyed a more widespread use is because the methodology, as it has currently been developed, is extremely process and equipment intensive. As a result, flip-chip technology is expensive to implement and provides many opportunities for problems to arise. In addition, process and performance requirements of the applications have reached the limits of current materials.

Existing flip-chip technology utilizes chips for which solder has been preapplied to the interconnection pads. The solder is normally either a 95Pb-5Sn or a 63Sn-37Pb alloy, and it is normally reflowed to form a nearly spherical "bump" prior to final board assembly.

A typical assembly process for flip-chip assembly involves the following steps: 1) flux paste is applied to the substrate bond pads; 2) the IC is aligned and placed on the substrate while the tackiness in the flux holds the chip in place; 3) the assembly is passed through the reflow oven and the solder melts and bonds metallurgically with the substrate pads; and 4) the sample is passed through a flux cleaning operation. Flux removal has normally been done with solvent rinses. Originally it was required to use chlorinated solvents to remove the flux residues, but more recently improvements to the flux chemistry has permitted the use of more desirable solvents.

The finished flip-chip assembly must then maintain electrical continuity throughout the lifetime of the device as measured by accelerated tests such as thermal cycling and thermal shock. Mismatches of both the coefficient of thermal expansion (CTE) and the elastic modulus (E) between the silicon IC and the PCB generate high stresses in the contact joints when the circuit is passed through thermal excursions. These stresses can lead to solder joint fatigue failure after repeated temperature cycles, and this is a primary failure mechanism for flip-chip joints. This mechanism has limited the selection of substrate materials mainly to ceramic hybrid substrates such as $Al_2O_3$, which has high modulus and low CTE, properties similar to silicon. Even with ceramic substrates, flip-chip assembly is limited to applications with small dice.

During the last ten to fifteen years there has been increasing interest in learning how to apply this flip-chip assembly to both larger size die and also to a broader range of printed circuit substrates. Specifically the increased wiring densities available with today's organic based substrates makes them suitable low cost substitutes for ceramic substrates. However, the relatively high CTE of organic materials has slowed the implementation of flip-chip assembly on organic substrates due to the aforementioned failure mechanism. An important breakthrough has been the development of underfill process. Underfill process uses a high modulus curable adhesive to fill the empty space between the solder balls under the chip so that the stress in the joint is shared by the adhesive and distributed more evenly across the entire interface as opposed to being concentrated at the perimeter balls. The use of an "underfill" adhesive as described above has enabled a flip-chip technology to be applied to a broader range of assemblies.

In current practice, underfill resin is applied as a liquid and is allowed to wick under the reflowed assembly. The current procedure for applying and curing underfill resins is separate from and is appended to the overall process sequence described above. After the reflow and flux removal steps, it is necessary to: pre-dry the bonded assembly, preheat the bonded assembly (to aid the wick-under), dispense resin, allow resin to wick under the die, dispense again, and then cure. Currently available underfill resins require cures of up to 2 hours at 150° C. The extra dispense steps are often needed in order to make sure that there is no entrapped air under the chip and also to provide a good fillet shape. Developing and maintaining good control over these types of material characteristics and dispensing processes is very difficult, and any imperfections will hurt the reliability of the solder joints.

Recently, an alternative approach for applying underfill resin has been pursued in which the uncured liquid resin is actually dispensed prior to the chip placement. In this case, special adhesive formulations are used that are capable of providing some degree of a fluxing action as they cure in the reflow oven. Because the resin is present on the board before the chip is placed, it is necessary to press the chip down into the resin and displace the resin from the contact sites. This approach eliminates an extra adhesive curing step, and also eliminates the subsequent dispense and wick-under step. However, it has been shown that in order for this approach to work, the underfill resin must be unfilled. The inability to utilize fillers in the underfill resin is a constraint that substantially limits the utility of this approach. See, for example, U.S. Pat. No. 5,128,746, Shi et al., High Performance Underfills for Low-Cost Flipchip Applications Proc. 3d Int'l Symp. On Adv. Packaging Materials, March 1997; Gamota et al., Advanced Flipchip Materials: Reflowable Underfill Systems, Proc. Pac. Rim ASME Int'l Intersociety Electronic and Photonic Packaging Conf., ASME, June 1997; Johnson et al., Reflow Curable Polymer Fluxes for Flipchip Assembly, Proc. Surface Mount Int'l 1997.

The choice of chemistry for the underfill adhesive is constrained by the processing and performance requirements stated above. For best fatigue performance, it is best to choose materials that have the highest modulus and lowest CTE over the temperature range of the thermal cycling. For polymers, this means a glass transition temperature (Tg) above 170° C. By filling polymers with inorganic fillers such as $SiO_2$ the CTE and modulus may be brought closer to that of silicon. However, to achieve CTE of less than 30 ppm per degrees Celsius in a polymer system, a filler loading of 50% by volume or higher is typically required. Such high filler loading raises the viscosity significantly. To achieve the required balance, it is common to use epoxy resins with the lowest possible viscosity. Highly filled and cured to a high Tg, these materials are quite brittle when cured and have poor adhesion to polyimide and aluminum nitride passivation layers on the IC's. The optimization of an underfill adhesive system is, therefore, a necessary compromise between processing requirements and performance requirements. An improved flip-chip assembly process or construction which reduced or eliminated any of these materials constraints has the potential to significantly improve the reliability of flip-chip assembly through improved chemistry.

In review of the background, a reliable solder flip-chip method of IC interconnect on ceramic substrates is just beginning to be applied to organic substrates. Significant processing and materials challenges are slowing this technology in spite of strong demand from designers. The current flip-chip assembly process has too many steps, is too costly and the reliability is limited due to the complex and conflicting materials requirements. A simplified flip-chip assembly process which reduces cost and demands from the underfill adhesive system will enable flip-chip assembly to become a more broadly attractive approach for circuit assembly.

SUMMARY OF THE INVENTION

The present invention provides a new way to simplify the flip-chip assembly process and enables the use of a broader range of materials thereby reducing assembly cost and improving interconnect reliability.

One aspect of the present invention relates to a method for connecting an integrated circuit chip to a circuit substrate. The method includes the step of pre-applying adhesive directly to a bumped side of the integrated circuit chip and removing portions of the adhesive to expose the bumps. The portions of adhesive can be removed after the adhesive application process, or can be removed during the application process. The method also includes the step of pressing the bumped side of the integrated circuit chip, which has previously been coated with adhesive, against the circuit substrate such that the bumps provide an electrical connection between the integrated circuit chip and the circuit substrate. The pre-applied adhesive on the chip forms a bond between the integrated circuit chip and the circuit substrate.

The above-described method provides numerous advantages over the prior art. For example, by applying the adhesive to the bumped IC prior to substrate attachment, encapsulation of the bumps is easier to achieve and can be more easily inspected. Also, because no wick under processes are used, the viscosity requirements for adhesive application are significantly relaxed as adhesives with viscosities on the order of about 1000 to about 30,000 poise may be used to achieve effective encapsulation. The removal of the viscosity constraint permits higher filler loading, and the use of alternative chemistries and catalysis systems. Such extra formulation latitude has the potential to enable higher reliability assemblies through improved adhesive material properties. Additionally, the above-described method offers the potential for fluxless attach due to the scrubbing action of the bumps as they deform in the bonding process.

Another aspect of the present invention relates to a method for preparing integrated circuit chips for assembly. The method includes the step of providing a wafer including a bumped side having a plurality of conductive bumps. The method also includes the steps of applying adhesive to the bumped side of the wafer, and dicing the wafer into individual integrated circuit chips. Because the adhesive is deposited at the wafer level, no dispensing, wicking, or damming are required. Additionally, with the use of faster curatives, post curing may be eliminated.

A further aspect of the present invention relates to an integrated circuit chip. The integrated circuit chip includes a bumped side having a plurality of conductive bumps. The chip also includes a layer of adhesive that covers the bumped side. The bumps have exposed contact regions that are substantially uncovered by the adhesive layer. The adhesive layer protects the bumped wafer during handling to increase yields. The exposed contact regions facilitate providing an electrical connection with a circuit substrate.

Still another aspect of the present invention relates to a conductive tape including an adhesive layer having a top surface and a bottom surface. The tape also includes a plurality of conductive particles disposed within the adhesive layer. At least one of the particles has an exposed top contact region at the top surface of the adhesive layer, and an exposed bottom contact region at the bottom surface of the adhesive layer.

One further aspect of the present invention relates to a method for providing an electrical connection between first and second electrical components. The method includes the step of providing a conductive tape having an adhesive layer including a top surface opposite a bottom surface and a plurality of conductive particles disposed within the adhesive layer. Each of the particles extends across a thickness of the adhesive layer and includes an exposed top contact region located at the top surface of the adhesive layer, and an exposed bottom contact region located at the bottom surface of the adhesive layer. The method also includes the step of pressing the conductive tape between the first and second electrical components.

An additional aspect of the present invention relates to a method for making a conductive tape. The method includes the step of applying adhesive to a plurality of conductive particles, and removing portions of the adhesive that overcoat the conductive particles such that exposed contact regions of the conductive particles are generated.

A variety of additional advantages of the invention will be set forth in part in the description which follows, and in part will be obvious from the description, or may be learned by practice of the invention. The advantages of the invention will be realized and attained by means of the elements and combinations particularly pointed out in the claims. It is to be understood that both the foregoing general description and the following detailed description are exemplary and explanatory only and are not restrictive of the invention as claimed.

BRIEF DESCRIPTION OF THE DRAWINGS

The accompanying drawings, which are incorporated in and constitute a part of this specification, illustrate several embodiments of the invention and together with the description, serve to explain the principles of the invention. A brief description of the drawings is as follows:

FIG. 3A shows the chip prior to abrasion and FIG. 3B shows the chip after abrasion;

FIG. 5A shows the chip prior to abrasion and FIG. 5B shows the chip after abrasion;

DETAILED DESCRIPTION OF THE PREFERRED EMBODIMENTS

Figure 1A:
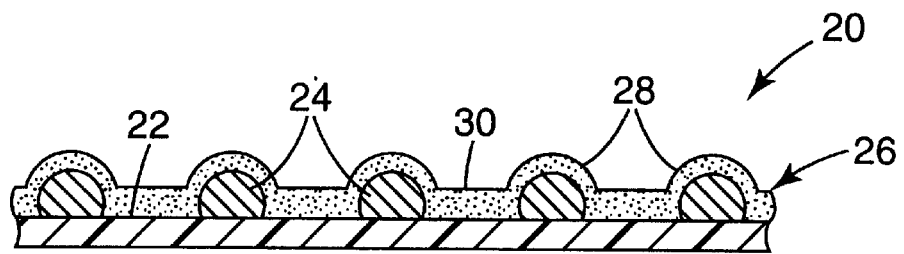
FIGS. 1A–1C illustrate a method for preparing an IC chip for connection to a circuit substrate.

Reference will now be made in detail to exemplary embodiments of the present invention which are illustrated in the accompanying drawings. Wherever possible, the same reference numbers will be used throughout the drawings to refer to the same or like parts.

The present invention provides an alternate means for applying underfill adhesive resin to an IC chips. In this case, underfill resin is applied to the bumped sides of IC chips, preferably at wafer level, before the chips have been bonded to an interconnect substrate such as a printed circuit board (PCB). The resin may be applied by techniques such as laminating a film material or by liquid coating. In contrast to traditional underfill methods that rely on wicking to cover the hidden surface, the present invention allows resin to be directly coated on the entire exposed surface/face of the IC chips. Consequently, the problems with entrapped air or incomplete filling typically associated with the traditional underfill are eliminated. With the present method, underfill resin coverage and thickness can be controlled to ensure uniformity. Because the wick-under process is eliminated, rheological requirements of the uncured resin are relaxed. This in turn can permit the use of alternative chemistries and higher filler loading to attain better mechanical properties after cure.

After the chips have been coated with the adhesive resin, or during the coating process itself, portions of the adhesive resin are removed to expose the tops of the solder bumps. For example, a mechanical process can be used to remove the previously applied adhesive from the tops of the bumps. Exemplary processes include rubbing the adhesive with an abrasive material, scraping the adhesive with a knife edge, or compressing the adhesive to thin and eventually crack or otherwise displace the adhesive material from the tops of the bumps. The above-described adhesive removal step is important because to achieve good metal-to-metal contact between the solder bumps and the interconnect substrate prior to the reflow step, the top surfaces of the bumps should preferably be at least partially exposed. The adhesive removal and bump exposing step also function to remove oxide films from the bumps that were formed during their initial reflow. Immediately after the bump exposure operation has been completed, a film or other type of protective cover may be applied to the wafer/chips to protect the adhesive and the exposed bumps.

After the protective film or cover has been applied to the chips, the wafer forming the chips is diced into a plurality of discrete chips. Following wafer dicing and removal of the protective film, a selected IC chip can be aligned and pre-attached to the interconnect substrate with heat and pressure. During this pre-attachment step, the solder bumps of the chip are deformed slightly in order to further ensure both good metal to metal contact between the IC and the interconnect substrate as well as good wetting of the adhesive to the substrate. Specifically the bump deformation accommodates the stand off of the IC from the substrate and allows the adhesive to be brought down to contact and fully wet the substrate surface thereby completely filling the cavity under the chip. In addition, the collapse of the bumps causes the surface oxides on the solder bumps to crack and open exposing fresh solder which is then smeared across the substrate pads forming a good metallurgical bond.

When the resin-coated IC chip is bonded to the interconnect substrate, the pre-applied adhesive forms and maintains a mechanical bond between the chip and the substrate significantly reducing the stress in the solder joints. Depending on the application, the solder joints may be formed without flux and still form reliable interconnects. In this case, the adhesive serves to affix the IC to the board prior to reflow instead of a flux paste. The solder reflow process can also serve to partially or even fully cure the underfill resin, which can possibly eliminate the need for an additional post cure.

Figure 1B:
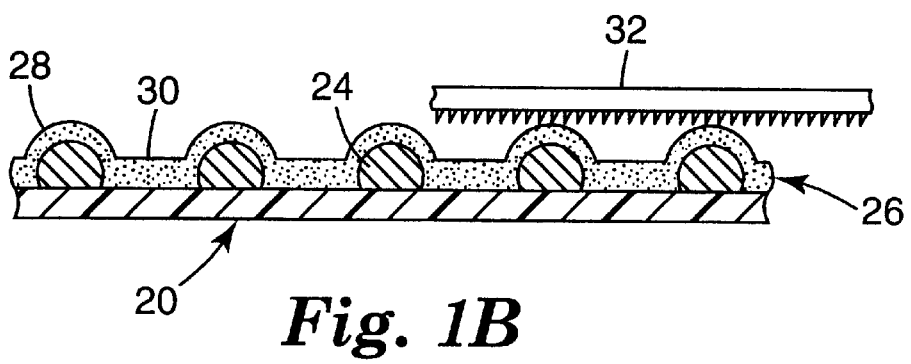
Figure 1C:
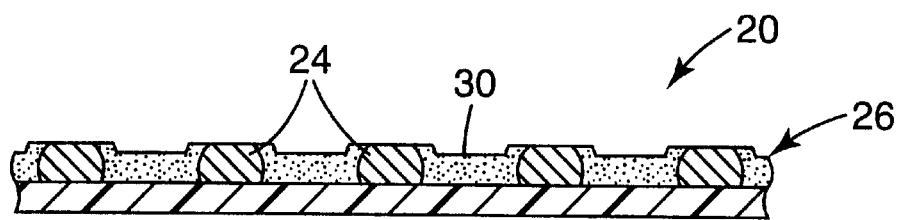

FIGS. 1A–1C show an exemplary process, in accordance with the principles of the present invention, for preparing an IC chip for electrical connection to a circuit substrate. FIG. 1A shows an IC chip 20 or wafer having a passivation surface 22 on which a plurality of conductive bumps 24, such as solder bumps, are disposed. The bumps 24 can be made of a variety of known conductive materials. Exemplary materials include meltable solid metals, gold, conductive slurries, conductive polymers, electroless nickel, and electroless gold.

The bumps 24 are preferably deposited on input/output pads of the chip 20 and protrude or project outward from the passivation surface 22 of the chip 20. The bumped side of the chip 20 has been covered with a layer of adhesive material 26 such as adhesive film or adhesive solution. The adhesive can be deposited or applied to the bumped side of the chip by any number of known techniques. For example, the adhesive can be coated as a hot melt, coated from solution, or bonded as a film in a lamination process.

The adhesive material 26 fills the volume around the bumps 24 and protects the bumps 24 during handling prior to assembly. As shown in FIG. 1A, the adhesive material 20 has a thickness which is less than the heights of the bumps 24. As a result, the exposed surface of the adhesive 26 has a plurality of adhesive protuberances 28 that correspond to the bumps 24. The protuberances 28 cover the bumps 24 and project outward from a substantially flat primary adhesive surface 30 that is located between the bumps 24. If the adhesive is applied as a liquid, the liquid is preferably b-stage cured or dried to form an adhesive film.

To ensure a better electrical connection with a substrate, it is preferred to at least partially remove the adhesive protuberances 28 that cover the bumps 24. As shown in FIG. 1B, an abrasion process is employed to remove the adhesive material located on top of the bumps 24 exposing the conductive bumps 24 for better electrical connection with a packaging substrate. In the abrasion process, an abrasive material 32 such as sandpaper, micro abrasive, abrasive pads available from 3M Company, St. Paul, Minn. under the trade designation Scotch Bright, a cloth, a scraping blade or a coating knife is brought in contact with the adhesive protuberances 28 that cover the bumps 24 such that the bumps 24 are exposed for electrical conduction. Because the protuberances project above the average adhesive height on the chip 20, such protuberances become pressure focal points that receive the most abrasion or cutting. FIG. 1C shows the chip 20 after the bumps have been exposed via abrasion. Once the bumps have been exposed, a film, tape or other type of protective cover may be applied to the chip 20 to protect the adhesive 26 and the exposed bumps 24.

A variety of techniques can be used to expose the conductive bumps 24. If the adhesive is coated as a liquid, a scraper or knife edge can be used to remove adhesive from the bumps during the coating process. For example, the knife could be used to spread the adhesive and simultaneously remove portions of the adhesive from over the bumps 24. Alternatively, the bumps 24 could be exposed via abrasion after the liquid adhesive has hardened. Furthermore, the adhesive could be applied as a film with portions of the film being removed by an abrasion process.

As shown in FIG. 1C, each bump 24 extends completely across the adhesive layer 26. In this manner, the height of each abraded bump 24 is roughly equal to or higher than the thickness of at least portions of the adhesive layer 26. Additionally, the exposed regions 36 of the bumps 24 are slightly raised with respect to the primary adhesive surface 30.

Figure 2A:
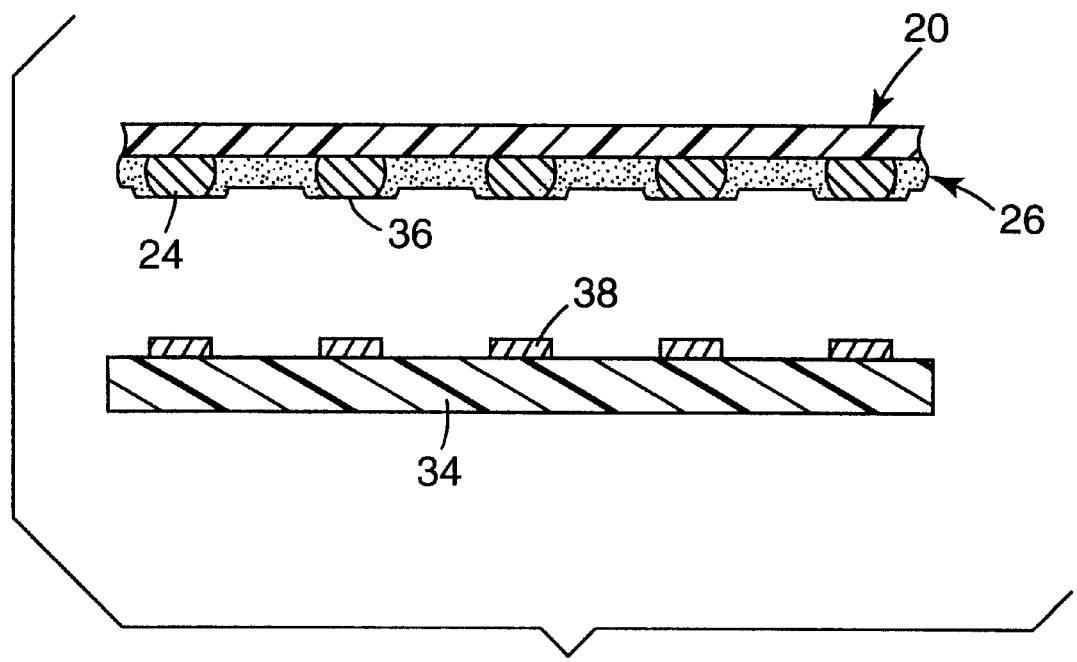
FIGS. 2A–2B illustrate a method for connecting the prepared IC chip of FIG. 1C to a circuit substrate.
Figure 2B:
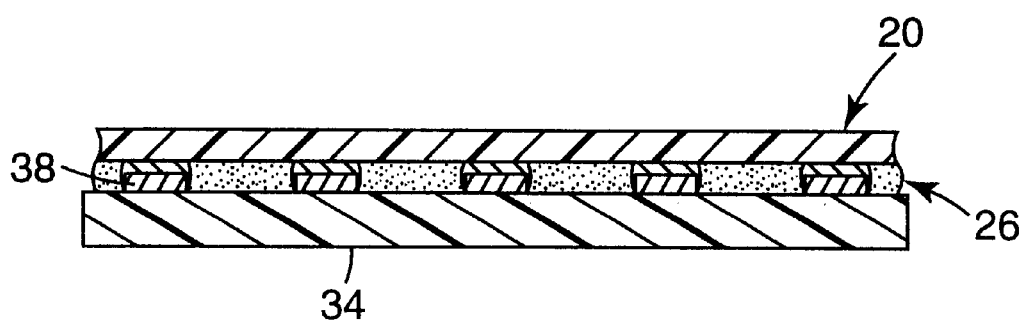

FIGS. 2A and 2B illustrate a method for electrically connecting the prepared chip 20 to a circuit substrate 34 such as a packaging circuit. To connect the chip 20 to the circuit substrate 34, exposed regions 36 of the bumps 24 are aligned with circuit pads 38 of the circuit substrate 34. Next, the chip 20 is pressed against the circuit substrate 34 with sufficient force to generate electrical contact between the bumps 24 and the circuit pads 38, and to cause the adhesive 26 to wet and fill around the bumps 24 and circuit substrate 34.

It is preferred for the bumps 24 to deform during the bonding process. By deforming the bumps 24, standoff between the chip 20 and the substrate 34 is reduced and the adhesive 26 is caused to fully wet and encapsulate the substrate circuit topography expelling entrapped air. The adhesive 26 may be cured during the bonding process or in a separate bake cure at a later time. Once cured, the adhesive 26 provides the mechanical bond between the IC chip 20 and substrate 34, redistributes the stresses at the solder joints and encapsulates the bumps 24 protecting them from the environment.

Figure 3A:
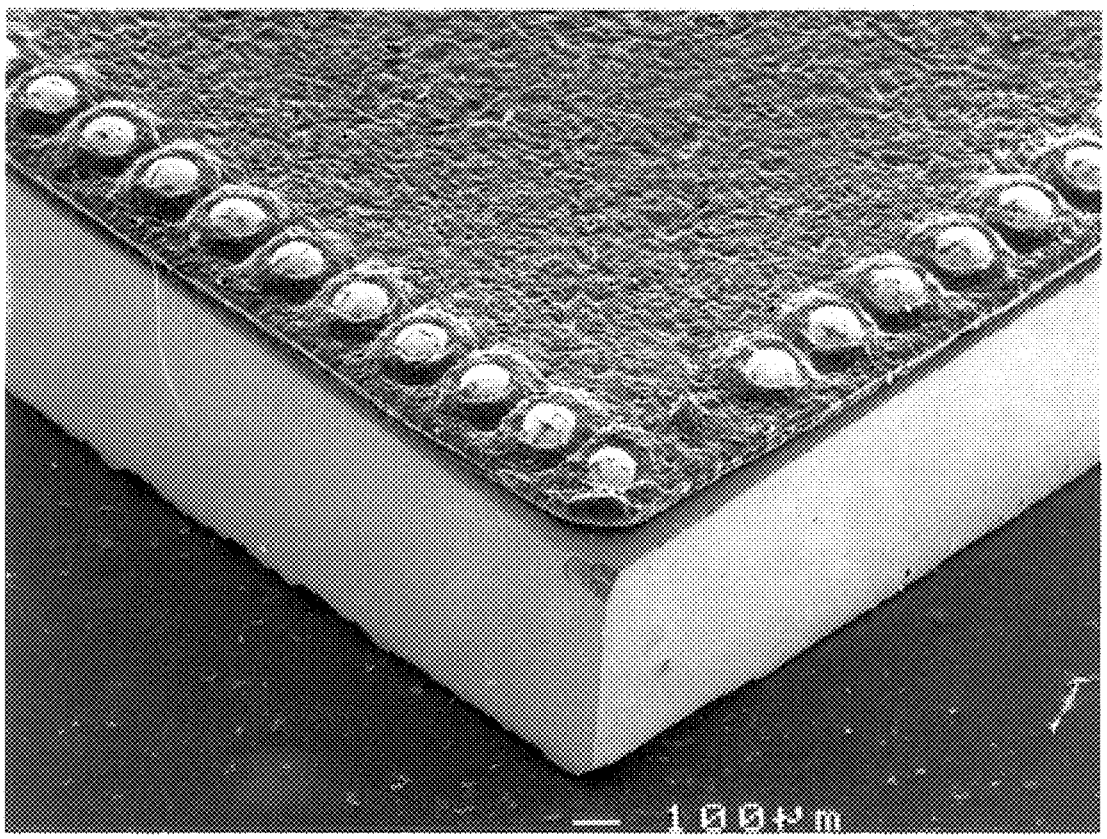
FIGS. 3A–3B are micrographs of an IC chip processed via the method of FIGS. 1A–1C.
Figure 3B:
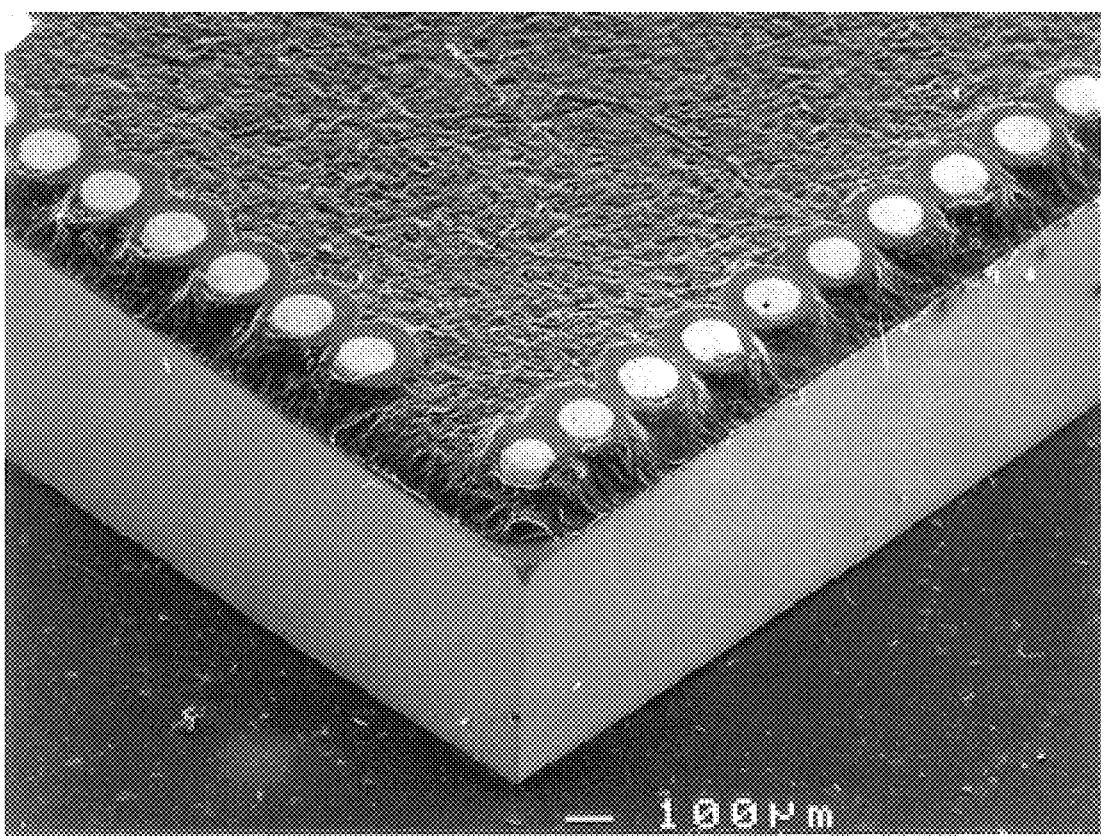

In an experimental example that illustrates the above-described aspects of the present invention, an IC clip manufactured by Flipchip Technology was utilized. Solder bumps having 4 mil diameters were located on the perimeter of the chip. An adhesive manufactured by DuPont, with a trade name of Pyralux LF, was used to overcoat the bumps. Specifically, a 3 mil thick layer of adhesive was placed on the bumped chip surface by pressing the adhesive to the chip that was heated to 100° C. on a hot plate. FIG. 3A is a micrograph of the chip after having been coated with adhesive. The 4 mil tall bumps were higher than the thickness of the adhesive, so there was substantial protrusion of these bumps above the primary adhesive surface on the chip surface. An Imperial Lapping Film micro abrasive manufactured by 3M Corporation was used to remove the adhesive from the tops of the bumps so as to expose the bumps. FIG. 3B is a micrograph the chip after the bumps have been exposed via abrasion. Inspections of the abraded parts found no evidence of abraded conductive material on the processed parts. The abraded adhesive and bump materials were apparently carried away by the abrasive film.

Figure 4A:
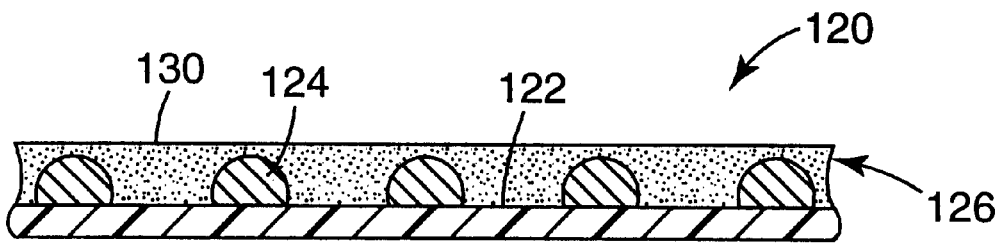
FIGS. 4A–4C illustrate an alternative method for preparing an IC chip for connection to a circuit substrate.
Figure 4B:
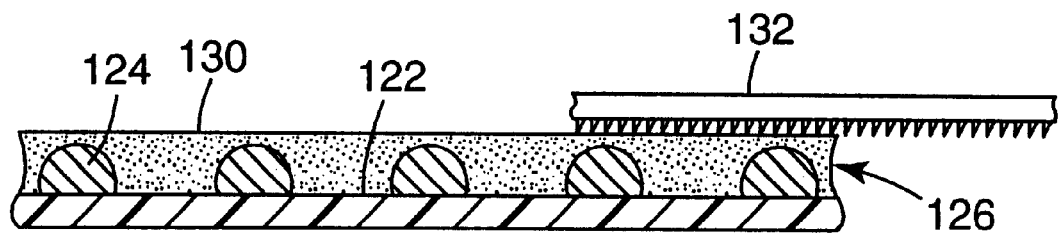
Figure 4C:
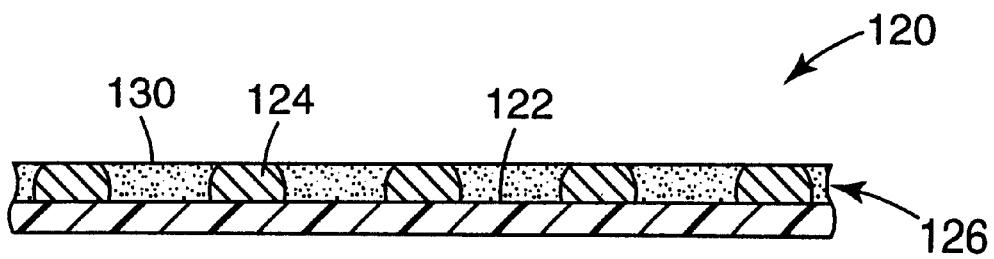

FIGS. 4A–4C illustrate another process, in accordance with the principles of the present invention, for preparing an IC chip for connection to a circuit substrate. It will be appreciated that the process of FIGS. 4A–4C has aspects that are similar to the process of FIGS. 3A–3C. For example, FIG. 4A shows an IC chip 120 including a plurality of conductive bumps 124 deposited on a passivation surface 122 of the chip 120. The bumped side of the chip 120 is covered with a layer of adhesive material 126 having a thickness equal to or greater than the heights of the bumps 124. The adhesive material 126 covers the bumps 124 and has an exposed primary surface 130 that is substantially parallel to the passivation surface 122.

As shown in FIG. 4B, a cutting or abrasion process is employed to remove the adhesive material on top of the bumps 124 exposing the conductive bumps 124 for better electrical connection with a packaging substrate. In the abrasion process, an abrasive material 132 is used to burnish the entire primary surface 130 of the adhesive 126 such that the bumps 124 are exposed for electrical conduction. FIG. 4C shows the chip 120 after the bumps have been exposed via abrasion. Once the bumps have been exposed, a film, tape or other type of protective cover may be applied to the chip 120 to protect the adhesive 126 and the exposed bumps 124.

As shown in FIG. 4C, each bump 124 extends completely across the thickness of the adhesive layer 126. In this manner, the height of each abraded bump 124 is roughly equal to the thickness of at least portions of the adhesive layer 126. Additionally, the exposed regions 136 of the bumps 124 are substantially flush with respect to the primary adhesive surface 130. It will be appreciated that the chip 120 can be connected to a circuit substrate in substantially the same manner previously described with respect to FIGS. 2A and 2B.

Figure 5A:
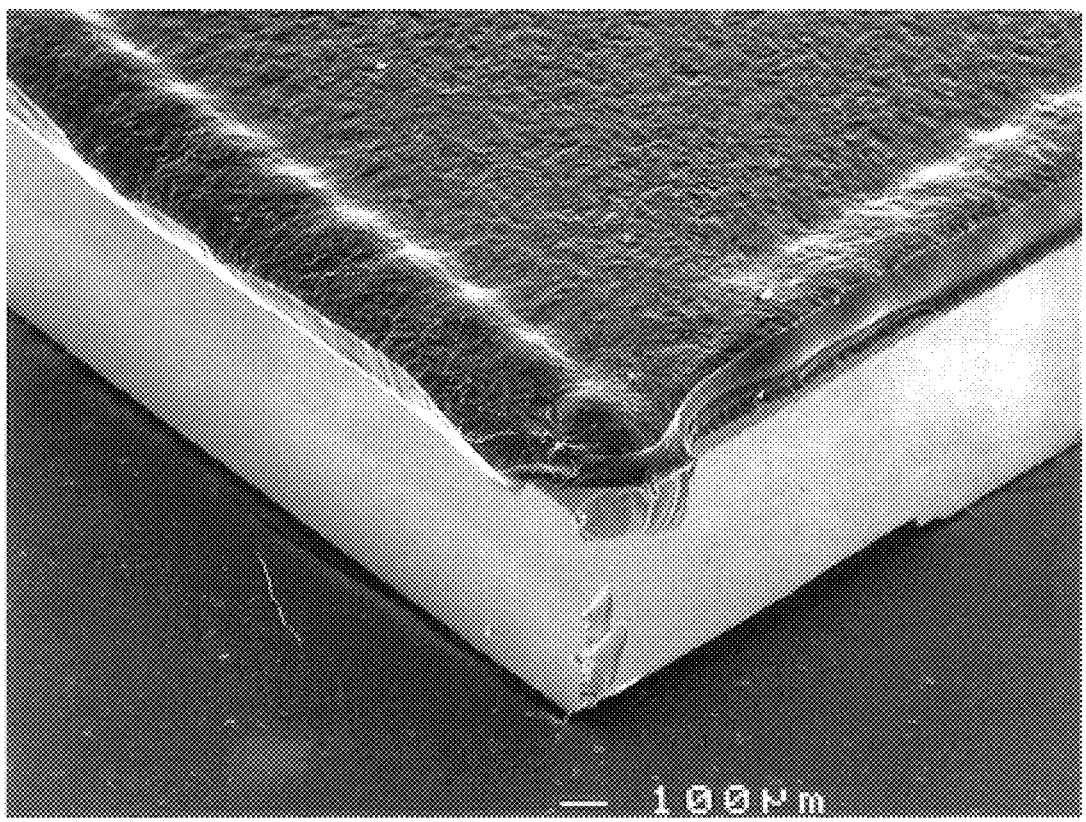
FIGS. 5A–5B are micrographs of an IC chip processed via the method of FIGS. 4A–4C.

FIG. 5A is a micrograph of an exemplary chip having bumps which have been coated with adhesive in the same manner the chip 120 of FIG. 4A.

Figure 5B:
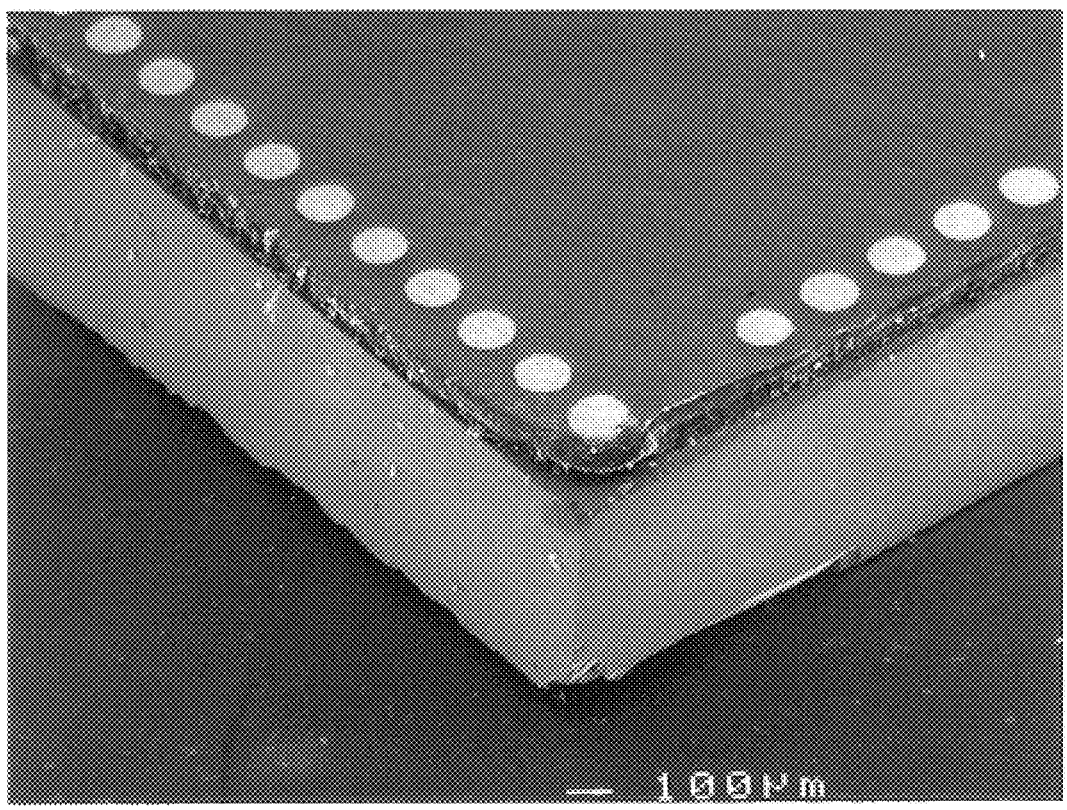

Additionally, FIG. 5B is a micrograph of the chip of FIG. 5A after portions of the adhesive have been abraded to expose the conductive bumps.

With respect to the above-described embodiments, if the adhesive coating has low flow characteristics during bonding, non-polished bumps may not be able to push through the adhesive to make contact with the bonding pads.

Figure 6A:
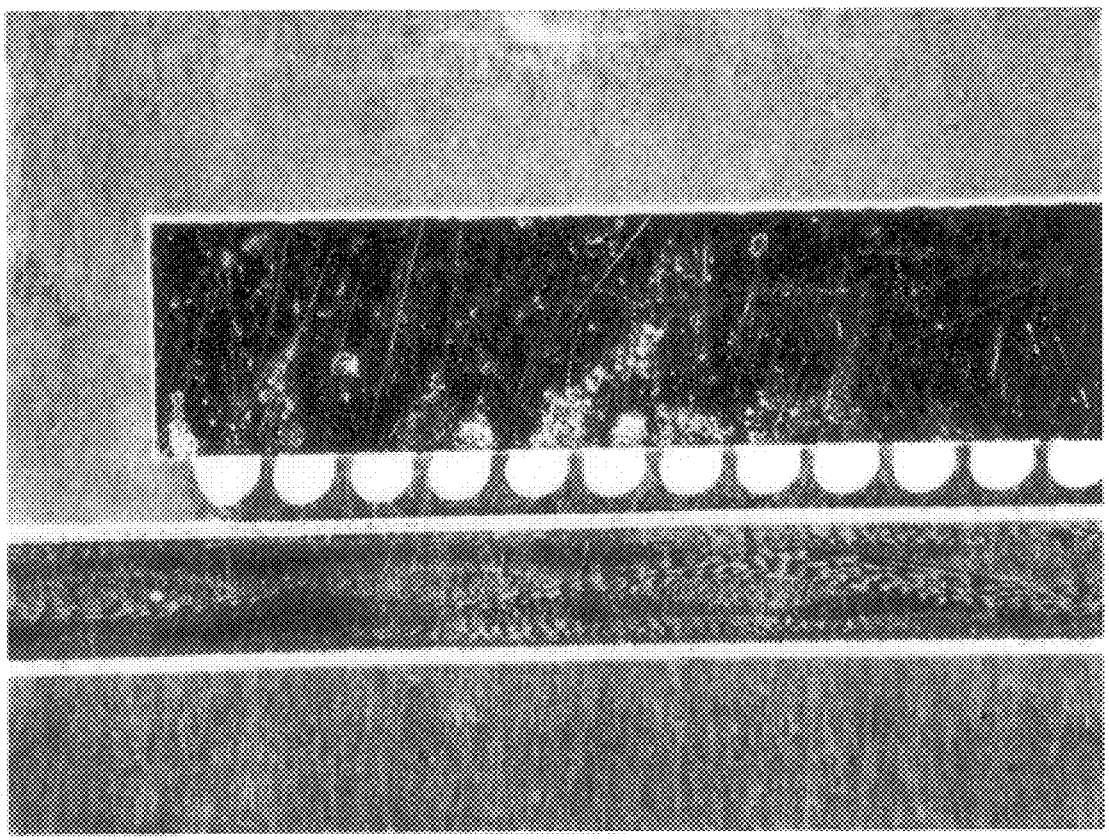
FIG. 6A is a cross-sectional micrograph of an IC chip connected to a circuit substrate, the IC chip was not subjected to an abrasion step prior to connection.
Figure 6B:
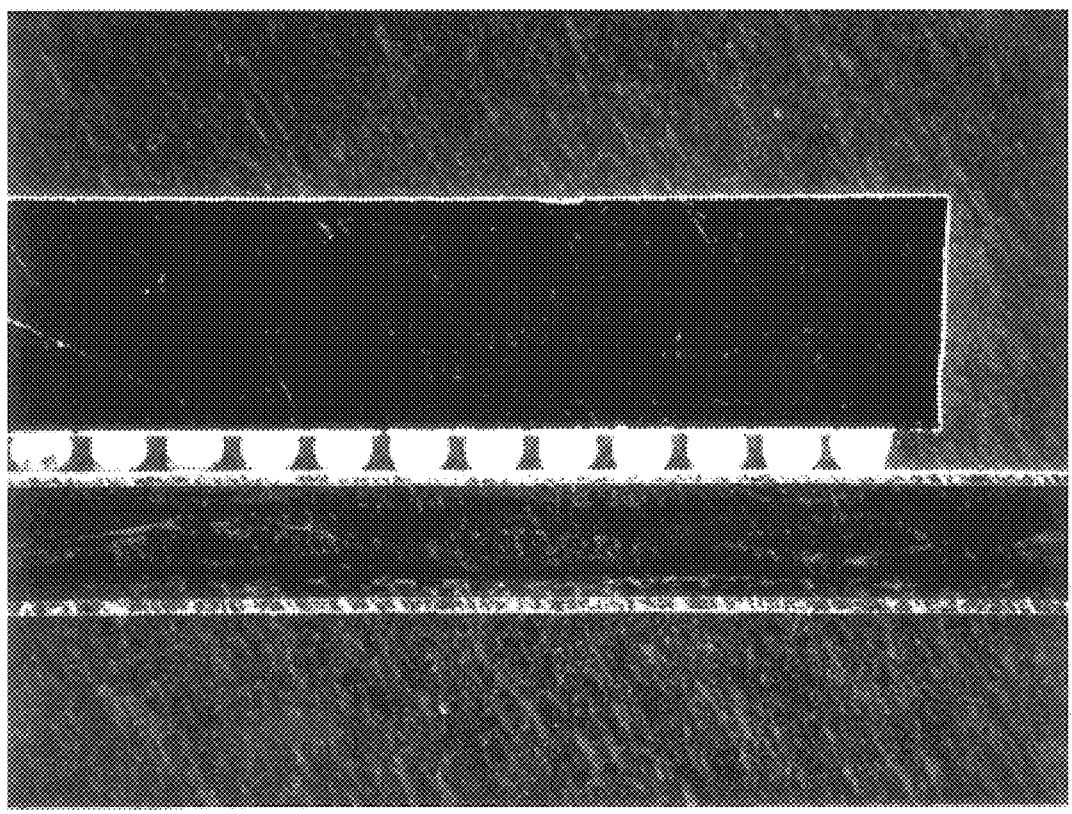
FIG. 6B is a crossectional micrograph of an IC chip connected to a circuit substrate, the IC chip was subjected to an abrasion step prior to connection.

FIG. 6A shows a cross-sectional image of a non-abraded chip bonded to a FR4 board using Pyralux, a no-flow adhesive manufactured by DuPont. The cross-sectional photo shows that the bumps are not in contact with the substrate because the adhesive is thick and covering the bumps. FIG. 6B shows a cross-sectional image of a polished/abraded chip bonded to a FR4 board using Pyralux. In contrast to the chip of FIG. 6A, the cross-section photo of FIG. 6B shows that the bumps are in contact with the substrate because the polishing process was used to remove the extra adhesive from the bump tops.

If the adhesive coating flows significantly, the bumps will push through the adhesive somewhat during bonding. However, the adhesive 126 can get trapped under the bump, thereby preventing good metallurgical bond formation. Consequently, even when high flow adhesives are utilized, it is still typically preferred to abrade the adhesives.

Figure 7A:
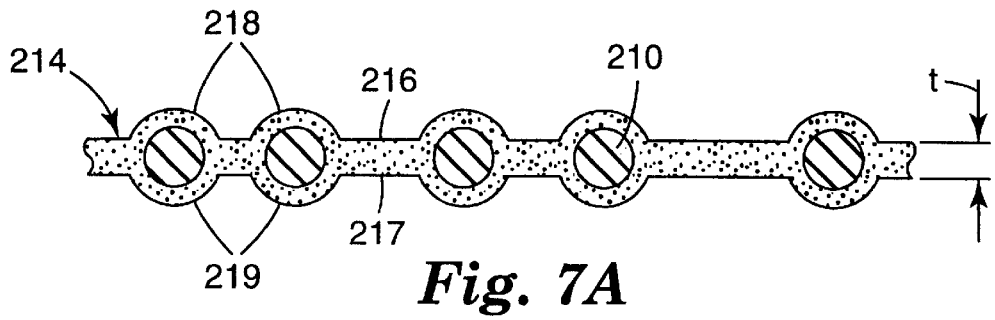
FIGS. 7A and 7B illustrate a method for making a conductive tape.
Figure 7B:
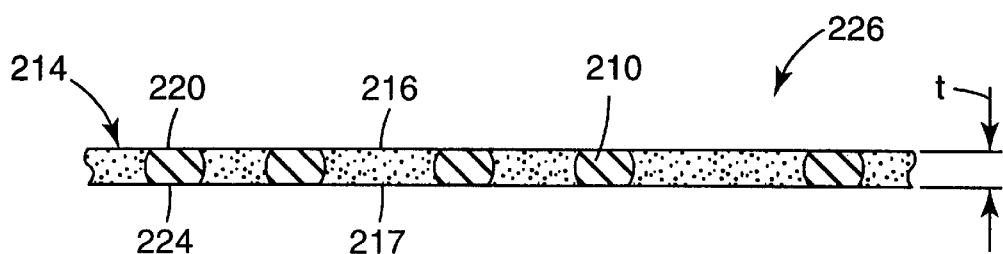

FIGS. 7A–7B show another aspect of the present invention which relates to a method for making a z-axis conductive tape. The method includes the step of providing an array of conductive particles 210. An exemplary size distribution for the particles is from 20–75 micrometers. The method also includes the step of coating the particles 210 with a layer of adhesive 214 as shown in FIG. 7A. The adhesive 214 can be applied to the particles 210 by a variety of techniques. For example, the adhesive can be coated as a hot melt, coated from solution, pressed as a film upon the particles 210, or bonded as a film in a lamination process. Additionally, the particles can be mixed within an adhesive suspension which is spread to form a layer or film of adhesive having a plurality of coated particles contained therein.

The adhesive 214 has a primary thickness t that is less than the size of the particles 210. As a result, the adhesive 214 has a top surface 216 having a plurality of humps or top protuberances 218 that correspond to the particles 210. The adhesive 214 also includes a bottom surface 217 having a plurality of bottom humps or protuberances 219 that correspond to the particles 210. Of course, in alternative embodiments of the present invention, the adhesive may have a primary thickness equal to or greater than the size of the particles. In such an embodiment, the adhesive would preferably define substantially flat top and bottom surfaces.

After the adhesive 214 has been applied to the particles 210, at least portions of the top protuberances 218 are removed such that top contact regions 220 of the particles 210 are exposed. Similarly, at least portions of the bottom protuberances 219 are removed such that bottom contact regions 224 of the particles 210 are exposed. The particles 210 can be exposed by techniques such as burnishing or polishing the top and bottom surfaces 216 and 217 of the adhesive 214 with an abrasive material.

In certain embodiments of the present invention, the particles 210 can initially be supported on a release liner (not shown) while adhesive is applied to the particles 210. In such an embodiment, after the particles 210 have been covered with the adhesive 214 and the top contact regions 220 have been exposed by techniques such as abrasion, the liner is removed from the back or bottom side 217 of the adhesive 214 allowing the bottom side 217 of the adhesive to be processed.

FIG. 7B shows the adhesive 214 after the top and bottom contact regions 220 and 224 have been exposed. The product depicted in FIG. 7B comprises a strip of conductive tape 226 suitable for providing z-axis electrical connections. The particles 210 of the tape 226 have sizes substantially equal to or greater than the thickness of the adhesive 214. As a result, each particle 210 extends completely across the thickness of the adhesive 214. A protective film or cover can be used to protect the exposed top and bottom contact regions 220 and 224 until the tape 226 is actually used to provide an electrical connection.

Figure 8A:
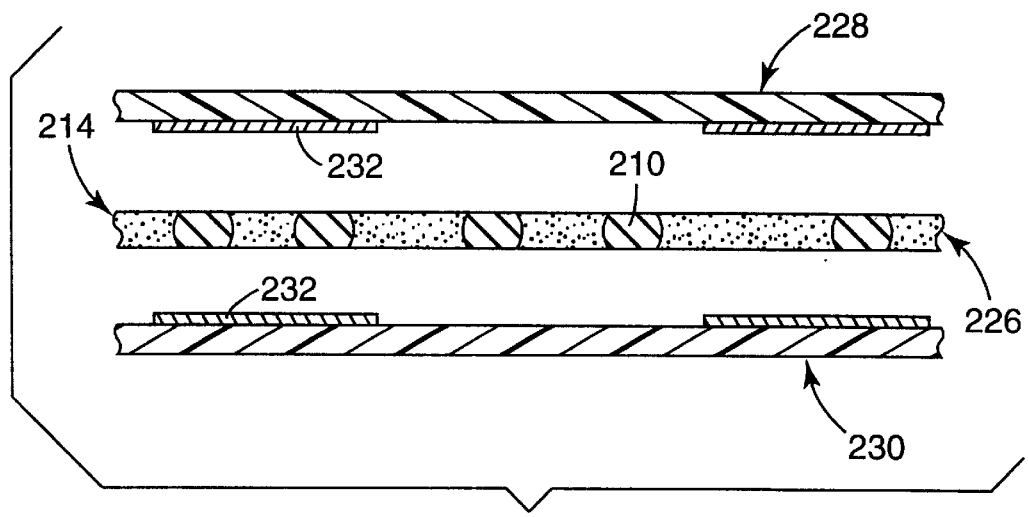
FIGS. 8A and 8B illustrate a method for making an electrical connection using the conductive tape of FIGS. 7A and 7B.
Figure 8B:
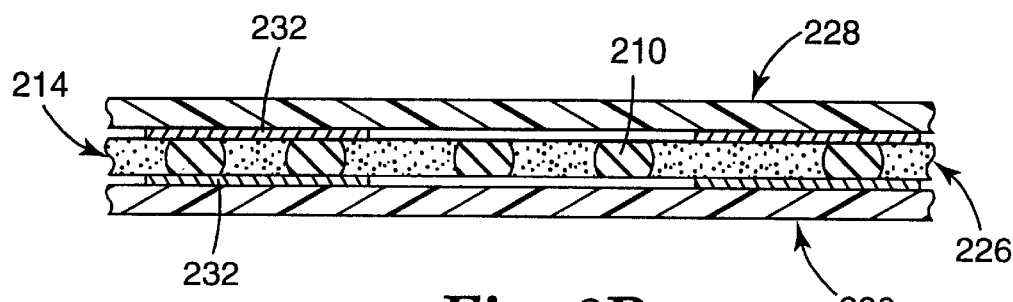

FIGS. 8A and 8B show a method of providing a z-axis connection between first and second electrical components 228 and 230 using the conductive tape 226. As shown in FIG. 8A, the conductive tape 226 is positioned between conducting pads 232 of the electrical components 228 and 230. Next, as shown in FIG. 8B, the tape 226 is pressed between the electrical components 228 and 230 with sufficient force to generate electrical contact between the particles 210 and the circuit pads 232. While the tape 226 is pressed, the tape 226 is also heated such that the adhesive 214 wets and fills around the particles 210, and forms a bond between the electrical components 228 and 230. The adhesive can be cured during the bonding process or in a separate bake cure at a later time.

Figure 9A:
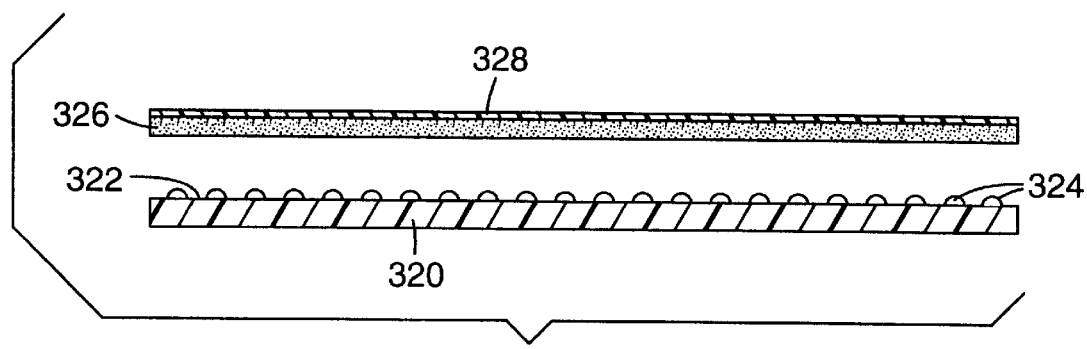
FIGS. 9A–9D illustrate a method for encapsulating bumps on wafer integrated circuits.

FIGS. 9A–9D illustrate an exemplary method for manufacturing integrated circuit chips in accordance with the principles of the present invention. FIG. 9A shows a wafer 320 having a passivation surface 322 on which a plurality of conductive bumps 324 are disposed. An adhesive film 326 with a protective backing 328 is located adjacent to the passivation surface 322.

Figure 9B:
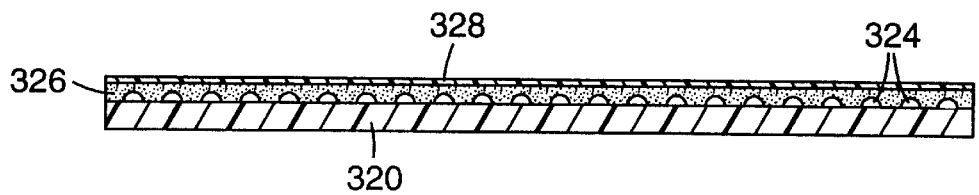

FIG. 9B shows the adhesive film 326 being pressed against the passivation surface 322 of the wafer 320. As the adhesive film 326 is pressed against the wafer 320, the adhesive 326 covers the bumps 324 and deforms to fill the voids around the bumps 324. Also, the adhesive film 326 bonds with the passivation surface 322 of the wafer 320.

Figure 9C:
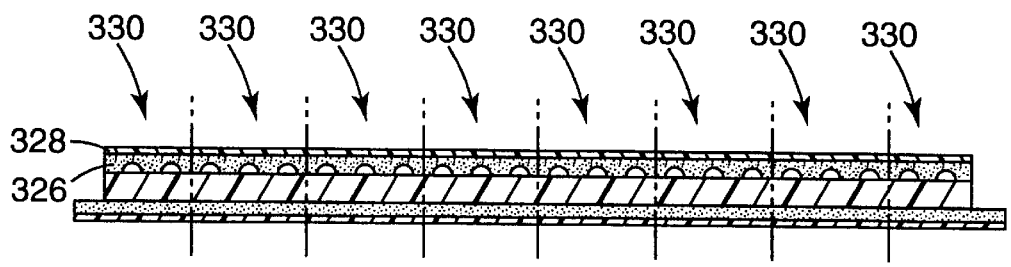
Figure 9D:
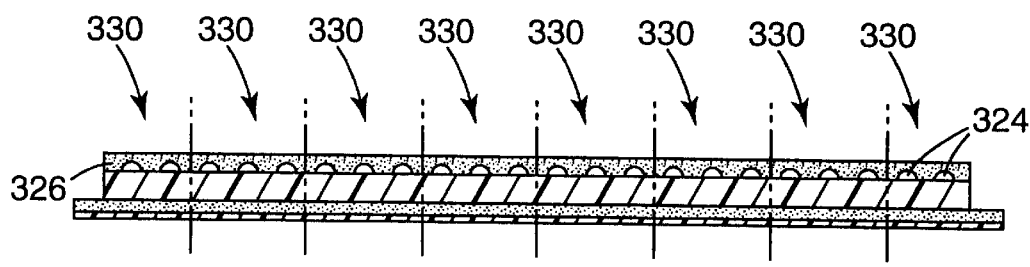

Next, as shown in FIG. 9C, the wafer 320, which has been pre-coated with adhesive, is diced or divided into discrete integrated circuits 330. Finally, as shown in FIG. 9D, the backing layer 328 is removed from the integrated circuits 330 such that the adhesive layer 326 is exposed. With the backing 328 removed, the integrated circuits are ready for connection to a substrate.

It will be appreciated that other techniques could also be used to apply adhesive to the wafer. For example, the adhesive can be coated as a hot melt or coated from solution. Additionally, the above-described method can also include the step of removing portions of the adhesive from the bumps to generate exposed contact areas as previously disclosed in the detailed description.

With regard to the foregoing description, it is to be understood that changes may be made in detail, especially in matters of the construction materials employed and the shape, size, and arrangement of the parts without departing from the scope of the present invention. It is intended that the specification and depicted embodiment be considered exemplary only, with a true scope and spirit of the invention being indicated by the broad meaning of the following claims.

We claim:

1. A method for manufacturing integrated circuit chips comprising the steps of:
   providing a wafer including a bumped side having a plurality of conductive bumps;
   applying adhesive to the bumped side of the wafer such that the adhesive extends between the conductive bumps of the wafer; and
   dicing the wafer on which the adhesive has been applied into individual integrated circuit chips.

2. The method of claim 1, wherein the adhesive is applied to the wafer by a technique selected from the group of coating the adhesive as a hot melt, coating the adhesive from solution, bonding the adhesive as a film in a lamination process, and pressing the adhesive as a film onto the bumped side of the wafer.

3. The method of claim 1, wherein when the adhesive is applied to the bumped side of the wafer, the conductive bumps are overcoated with adhesive.

4. The method of claim 3, wherein prior to dicing the wafer, overcoat portions of the adhesive are removed to expose contact regions of the conductive bumps.

5. The method of claim 4, wherein the overcoat portions of adhesive are removed by abrasion.

6. The method of claim 4, wherein prior to removing the overcoat portions of adhesive, the conductive bumps have heights that are greater than a thickness of the adhesive.

7. The method of claim 4, wherein prior to removing the overcoat portions of adhesive, the conductive bumps have heights that are smaller than a thickness of the adhesive.

8. The method of claim 4, wherein after removing the overcoat portions of adhesive, the conductive bumps have heights approximately equal to or greater than a thickness of the adhesive.

9. The method of claim 4, wherein after removing the overcoat portions of the adhesive, the exposed contact regions of the conductive bumps are substantially flush with a primary exposed surface of the adhesive.

10. The method of claim 4, wherein after removing the overcoat portions of the adhesive, an offset exists between the exposed contact regions of the conductive bumps and a primary exposed surface of the adhesive.

11. The method of claim 4, wherein after the overcoat portions of adhesive are removed, and prior to dicing the wafer, a protective cover is placed over the adhesive and exposed contact regions.

* * * * *